US011860475B2

(12) United States Patent
Seo et al.

(10) Patent No.: US 11,860,475 B2
(45) Date of Patent: Jan. 2, 2024

(54) DISPLAY DEVICE

(71) Applicant: LG DISPLAY CO., LTD., Seoul (KR)

(72) Inventors: Byung-Hyuck Seo, Paju-si (KR);
Young-Hun Jeong, Paju-si (KR);
Sun-Woong Kim, Paju-si (KR);
Seung-Soo Yang, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 1 day.

(21) Appl. No.: 17/981,352

(22) Filed: Nov. 4, 2022

(65) Prior Publication Data
US 2023/0185129 A1 Jun. 15, 2023

(30) Foreign Application Priority Data

Dec. 14, 2021 (KR) .................. 10-2021-0179025

(51) Int. Cl.
*G02F 1/13357* (2006.01)
*H01L 33/60* (2010.01)
*H01L 33/32* (2010.01)
*H01L 25/075* (2006.01)

(52) U.S. Cl.
CPC .. *G02F 1/133606* (2013.01); *G02F 1/133605* (2013.01); *G02F 1/133611* (2013.01); *H01L 33/60* (2013.01); *G02F 2201/50* (2013.01); *G02F 2202/28* (2013.01); *H01L 25/0753* (2013.01); *H01L 33/325* (2013.01)

(58) Field of Classification Search
CPC ......... G02F 1/133606; G02F 1/133605; G02F 1/133611; G02F 2201/50; G02F 2202/28; H01L 33/60; H01L 33/325; H01L 25/0753
See application file for complete search history.

(56) References Cited

FOREIGN PATENT DOCUMENTS

| KR | 10-2016-0004428 | 1/2016 | |
|---|---|---|---|
| KR | 10-2021-0022955 | 3/2021 | |
| KR | 20210057997 A | * 5/2021 | ....... G02F 1/133314 |

OTHER PUBLICATIONS

Machine translation of KR-20210057997-A (Year: 2021).*

* cited by examiner

*Primary Examiner* — Anne M Hines
*Assistant Examiner* — Jose M Diaz
(74) *Attorney, Agent, or Firm* — POLSINELLI PC

(57) ABSTRACT

A display device includes: a light source unit including a plurality of light sources; a cover bottom including a horizontal surface on which the plurality of light sources are seated, and a side surface bent along an edge of the horizontal surface; an optical unit on the light source unit; a display panel on the optical unit; a first module film being transparent, supporting a back surface of the optical unit, and including a first edge portion attached to and fixed to an outer side of the side surface of the cover bottom; and a second module film being transparent, attached to a back surface of the display panel, and including a second edge portion attached to and fixed to an outer side of the edge portion.

15 Claims, 10 Drawing Sheets

DISPLAY DEVICE

CROSS-REFERENCE TO RELATED APPLICATION

The present application claims the priority of Korean Patent Application No. 10-2021-0179025 filed on Dec. 14, 2021, which is hereby incorporated by reference in its entirety.

BACKGROUND

Field of the Disclosure

The present disclosure relates to a display device, and more particularly, to a display device having a narrow bezel.

Description of the Background

Recently, with a development of information technology and mobile communication technology, a display device capable of visually displaying information has been developed. The display device is largely classified into a self-luminous type display device having an emission characteristics and a non-self-luminous type display device capable of displaying an image with other external elements.

A liquid crystal display device (LCD) may be exemplified as a non-self-luminous type display device that does not have a self-luminous element.

Accordingly, the LCD, which is a non-self-luminous type display device, requires a separate light source. A backlight unit having a light source on a back of the LCD is provided to irradiate a light toward a front of the LCD, and accordingly, an identifiable image is realized.

Meanwhile, recently, as such the display device has been used not only in portable computers but also in desktop computer monitors and wall-mounted televisions, its use fields have gradually expanded. Researches to reduce weight and volume while having a large display device have been actively conducted.

Furthermore, in addition to lightweight and thin profile, there is also a demand for a narrow bezel in which a display area is wide and a bezel area that is a non-display area other than the display area is formed as small as possible.

Accordingly, by removing a top cover for modularizing a display panel and a backlight unit, and attaching and fixing the display panel to a guide panel through an adhesive pad such as a double-sided tape, it is intended to realize a light weight, a thin profile and a narrow bezel. However, since such the display device also has a limitation in narrow bezel, the narrow bezel recently required is not satisfied.

SUMMARY

Accordingly, the present disclosure is directed to a display device that substantially obviates one or more of the problems due to limitations and disadvantages described above.

An advantage of the present disclosure is to provide a display device having a light weight, a thin profile and a narrow bezel.

Another advantage of the present disclosure is to provide a display device which can reduce a process cost and improve process efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a light source unit including a plurality of light sources; a cover bottom including a horizontal surface on which the plurality of light sources are seated, and a side surface bent along an edge of the horizontal surface; an optical unit on the light source unit; a display panel on the optical unit; a first module film being transparent, supporting a back surface of the optical unit, and including a first edge portion attached to and fixed to an outer side of the side surface of the cover bottom; and a second module film being transparent, attached to a back surface of the display panel, and including a second edge portion attached to and fixed to an outer side of the first edge portion.

According to another aspect of the present disclosure, a display device includes: a display panel; a backlight unit disposed on a back surface of the display panel, and including a light source unit including a plurality of light sources, a reflective plate disposed on the light source unit and including a plurality of through holes exposing only the plurality of light sources, and an optical unit disposed on the reflective plate; a cover bottom including a horizontal surface on which the plurality of light sources are seated, and a side surface bent along an edge of the horizontal surface; a first module film being transparent, supporting a back surface of the optical unit, and including a first edge portion attached to and fixed to an outer side of the side surface of the cover bottom; and a second module film being transparent, attached to a back surface of the display panel, and including a second edge portion attached to and fixed to an outer side of the first edge portion, wherein the display panel and the backlight unit are integrally modularized through the cover bottom and the first and second module films.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Hereinafter, an aspect according to the present disclosure is described with reference to the drawings.

Figure 1:
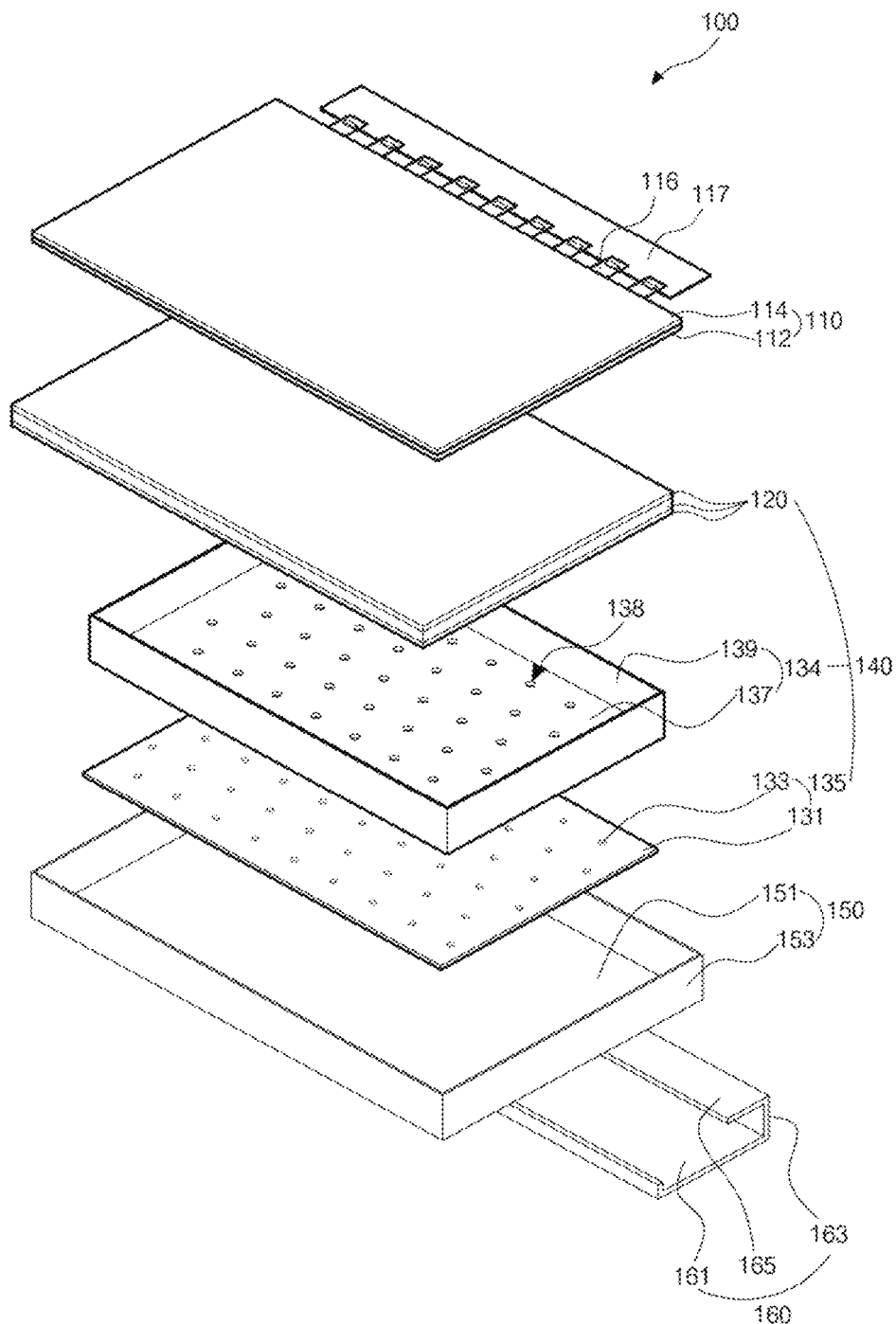
FIG. 1 is an exploded perspective view schematically illustrating a display device according to an aspect of the present disclosure.

FIG. 1 is an exploded perspective view schematically illustrating a display device according to an aspect of the present disclosure.

As shown in FIG. 1, the display device 100 according to the aspect of the present disclosure may include a display panel 110, a backlight unit 140, and a cover bottom 150 and a module film (211 and 221 of FIG. 2) for modularizing the display panel 110 and the backlight unit 140.

At this time, when a direction in the drawing is defined for convenience of explanation, on the premise that the display surface of the display panel 110 faces forward, the backlight unit 140 is disposed behind the display panel 110, and the cover bottom 150 is positioned on a back surface of the backlight unit 140, and the display panel 110, the backlight unit 140 and the cover bottom 150 are modularized.

This is described in more detail below.

The display panel 110 may be a liquid crystal display panel, a plasma display panel, a field emission display panel, an electroluminescence display panel and an organic light emitting diode display panel.

Hereinafter, for convenience of explanation, a liquid crystal display panel that displays an image by controlling an electric field applied to a liquid crystal layer of the display panel 110 and changing an arrangement of liquid crystal molecules to transmit a light emitted from the backlight unit 140 to the display panel 110 is described as an example.

The display panel 110 is a part that plays a key role in image expression, and may include first and second substrates 112 and 114 bonded to each other to face each other with a liquid crystal layer interposed therebetween.

At this time, on the premise of an active matrix type, although not clearly shown in the drawing, a plurality of gate lines and data lines may cross each other on an inner surface of the first substrate 112, which is usually called a lower substrate or an array substrate, to define a plurality of pixels, and a thin film transistor (TFT) may be provided at each crossing portion and may be connected to a transparent pixel electrode formed in each pixel.

On an inner surface of the second substrate 114 which is called an upper substrate or color filter substrate, red (R), green (G) and blue (B) color filters and a black matrix which surrounds each of the red (R), green (G) and blue (B) color filters and covers non-display elements such as the gate line, the data line, the TFT and the like may be provided. In addition, a transparent common electrode covering the color filters and the black matrix may be provided.

In addition, although not clearly shown in the drawing, upper and lower alignment layers that determine an initial arrangement direction of the liquid crystal molecules may be interposed between the two substrates 112 and 114 and the liquid crystal layer. A seal pattern may be formed along edges of both the substrates 112 and 114 to prevent leakage of the liquid crystal layer filled between the two substrates 112 and 114.

In this case, upper and lower polarizing plates 119b and 119a (of FIG. 2) may be attached to outer surfaces of the first and second substrates 112 and 114, respectively.

In addition, a side sealing agent (115 of FIG. 3), which has elasticity and serves to absorb an external impact, may be provided at other sides except for a side including a pad portion, to which a printed circuit board 117 including a driving circuit is connected, out of sides of the display panel 110.

The side sealing agent (115 of FIG. 3) may serve to protect the sides of the display panel 110, and the side sealing agent (115 of FIG. 3) may serve to prevent damage to the display panel 110 caused by an external impact.

In addition, the side sealing agent (115 of FIG. 3) may also serve to prevent light leakage of the display panel 110.

The printed circuit board 117 may be connected to the side of the display panel 110, which the side sealing agent (115 of FIG. 3) is not located on, via a connection member 116 such as a flexible printed circuit board.

The printed circuit board 117 may be bent and closely adhered to the back surface of the cover bottom 150 during the modularization process by using the bending characteristics of the connecting member 116.

Accordingly, in the display panel 110, when the thin film transistor selected for each gate line is turned on by an on/off signal of the thin film transistor scanned and transmitted to the gate line, an image signal of the data line is transferred to the corresponding pixel electrode, and by an electric field between the pixel electrode and the common electrode generated by this, an arrangement direction of liquid crystal molecules is changed, thereby producing a difference in transmittance.

In addition, in order to express a difference in transmittance of the display panel 110 to an outside, the display device 100 according to the present disclosure may include the backlight unit 140 that supplies light from a back of the display panel 110.

The backlight unit 140 may include a light source unit 135, a reflective plate 134, and an optical unit 120 which are located on the back of the display panel 110, and the optical unit 120 may be positioned on the light source unit 135 to be spaced apart from the light source unit 135 by a predetermined distance.

The light source unit 135 may include a plate-shaped PCB 131 seated on a horizontal surface 151 of the cover bottom 150 and a plurality of light sources 133 mounted at predetermined distances on the PCB 131.

The light source 133 may be an LED or a micro LED (µLED). The LED or micro LED may be manufactured by crystallizing an inorganic material such as GaN on a semiconductor wafer substrate such as sapphire or silicon (Si).

The LED or micro LED may be crystallized through an epitaxial growth process. The epitaxial growth process may refer to growing by taking a specific orientation relationship on a surface of a certain crystal. In order to form a structure of LED or µLED, GaN-based compound semiconductor may be stacked on a substrate in a form of a pn junction diode. At this time, each layer may grow by inheriting a crystallinity of an underlying layer.

In addition, the LED or micro LED may include an n-doped n-type semiconductor layer, one or more multi-quantum well (MQW) layers, and a p-doped p-type semiconductor layer.

The n-type semiconductor layer may be made of a semiconductor material such as GaN, AlGaN, InGaN, and AlInGaN or the like, and may include Si, Ge, Se, Te, C or the like as impurities. The p-type semiconductor layer may be made of a semiconductor material such as GaN, AlGaN, InGaN, and AlInGaN or the like, and may include Mg, Zn, Be or the like as impurities.

In addition, the multi-quantum well layer may have a multi-quantum well structure, for example, InGaN/GaN.

The multi-quantum well layer may emit a light of any one color among red, green and blue, or may emit a light of different color. For example, when the multi-quantum well layer includes an InGaAlP material, a red light may be emitted. When the multi-quantum well layer includes an InGaN material and the In content is varied, a green or blue light may be emitted.

Here, the light source 133 according to the aspect of the present disclosure may be formed of a blue LED or a blue micro LED including a multi-quantum well layer emitting a blue light of excellent emission efficiency and luminance in order to improve emission efficiency and luminance.

In this case, the PCB 131 may be divided into a plurality of bar-shaped portions.

A light diffusing lens (not shown) may be further provided on each light source 133. The light diffusing lens positioned on each light source 133 may improve a directivity angle of a light emitted from the light source 133.

Here, the reflection plate 134 may have a plurality of through holes 138 through which the plurality of light sources 133 can pass, and may cover and shield an horizontal surface of the PCB 131 except for the plurality of light sources 133, and the horizontal surface 151 and a side surface 153 of the cover bottom 150.

Accordingly, by reflecting the light directed toward the back of the plurality of light sources 133 toward the optical unit 120, a luminance of light is improved.

That is, the reflective plate 134 may be formed of a white or silver plate. The reflective plate 134 may include the plurality of through-holes 138, a reflective plane 137 that covers the horizontal surface 151 of the cover bottom 150, and a reflective side surface 139 that is bent upward along edges of the reflective plane 137 to cover an inner side of the side surface 153 of the cover bottom 150.

The optical unit 120 for uniformity of luminance may be positioned on the plurality of light sources 133 exposed through the through-holes 138 of the reflective plate 134. The optical unit 120 may include a luminance enhancing portion (129 of FIG. 3), and first and second optical portions (121*a* and 121*b* of FIG. 3) and a diffusion portion (128 of FIG. 3), and the optical unit 120 may process a light emitted from the light source unit 135 in high quality and supply the light to the display panel 110.

Figure 2:
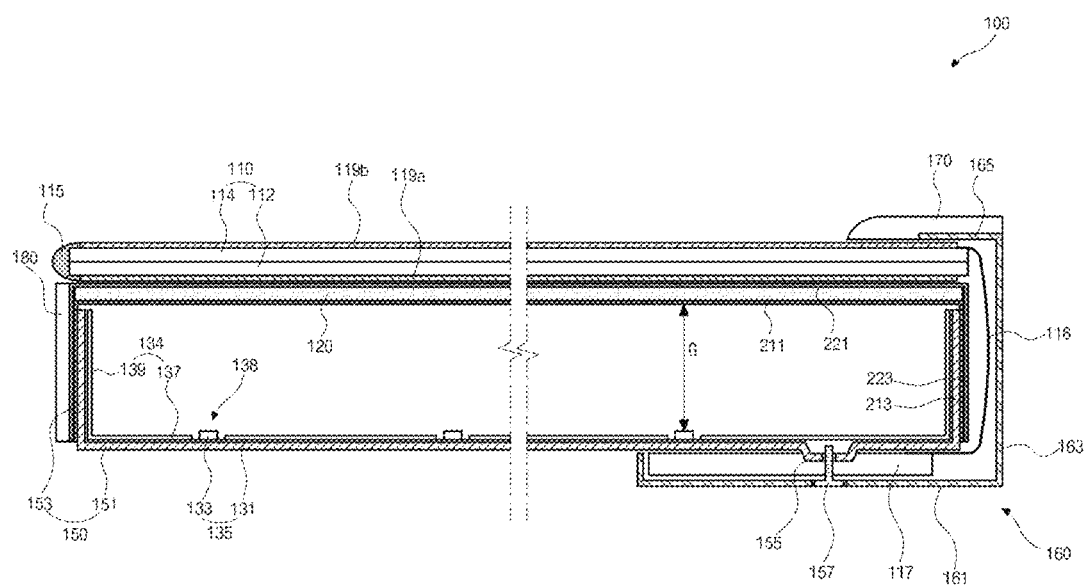
FIG. 2 is a cross-sectional view schematically illustrating a modularized display device of FIG. 1.

The display panel 110 and the backlight unit 140 may be integrally modularized through the cover bottom 150 and the module films (211 and 221 of FIG. 2).

Here, the cover bottom 150, which the display panel 110 and the backlight unit 140 are seated on and is a basis for assembling the entire components of the display device 100, may include the plate-shaped horizontal surface 151 and the side surface 153 vertically bent at an edge of the horizontal surface 151.

At this time, a cover shield 160 may be further provided on the back of the cover bottom 150 and serve to protect the printed circuit board 117 disposed on the back of the cover bottom 150 and efficiently dissipate a heat generated from the printed circuit board 117.

In particular, in the display device 100 according to the aspect of the present disclosure, the cover shield 160 may include a bottom surface 161 facing the back surface of the cover bottom 150, a side surface 163 that is vertically bent from the bottom surface 161 to entirely surround a surface of the display device 100, and a top surface 165 that is vertically bent from the side surface 163 and surrounds a portion of an edge of a top surface of the display panel 110.

Thus, the cover shield 160 may completely cover one side of the display device 100 on which the printed circuit board 117 is positioned.

Through this, in the display device 100 according to the aspect of the present disclosure, the cover shield 160 may serve as an outer cover of the final application product.

In addition, the module films (211 and 221 of FIG. 2) may be divided into first and second module films (211 and 221 of FIG. 2) positioned on a top surface and a back surface of the optical unit 120. The first and second module films (211 and 221 of FIG. 2) may be attached to and fixed to the display panel 110 and the cover bottom 150.

Accordingly, the present disclosure may provide the display device 100 having light weight and thin profile and narrow bezel, while omitting a guide panel (not shown) made of aluminum (Al) and a glass diffusion plate (not shown) made of aluminum (Al), thereby reducing a material cost, and further, can omit a process for modularizing the guide panel (not shown) and the glass diffusion plate (not shown), thereby improving an efficiency of process.

This is described in more detail with reference to the drawings below.

Figure 3:
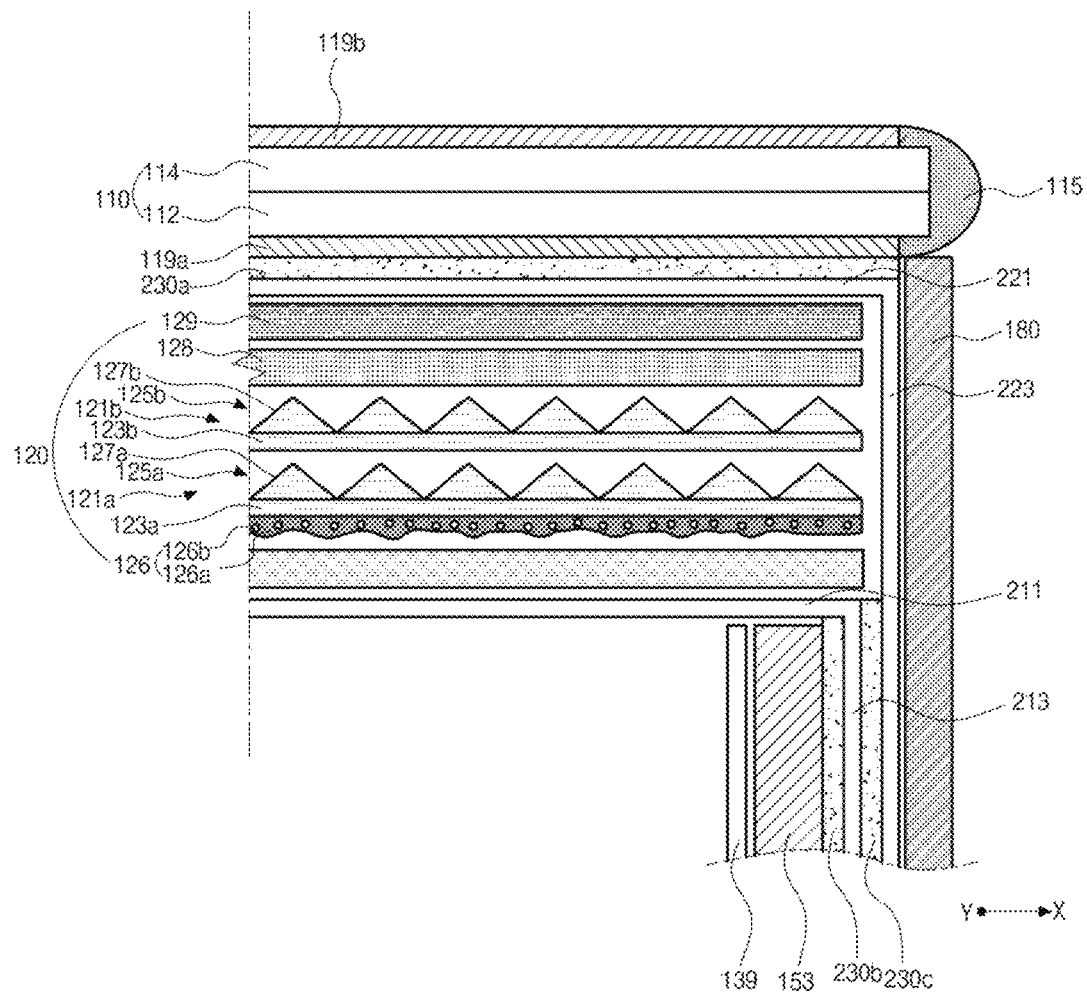
FIG. 3 is a cross-sectional view schematically illustrating a configuration of an optical unit and a module film according to an aspect of the present disclosure.

FIG. 2 is a cross-sectional view schematically illustrating a modularized display device of FIG. 1, and FIG. 3 is a cross-sectional view schematically illustrating a configuration of an optical unit and a module film according to an aspect of the present disclosure.

As shown in FIG. 2, the light source unit 135 including the plate-shaped PCB 131 and the plurality of light sources 133 mounted on the PCB 131, the reflective plate 134 only exposing each light source 133 through the through hole 138, and the optical unit 120 stacked on the light source unit 135 may form the backlight unit (140 in FIG. 1).

In addition, the display panel 110 including the first and second substrates 112 and 114 and a liquid crystal layer (not shown) interposed therebetween may be positioned on the backlight unit (140 in FIG. 1), and the first and second polarizing plates 119*a* and 119*b* that selectively transmit only specific light may be attached to outer surfaces of the first and second substrates 112 and 114.

Here, the side sealing agent 115 covering from a side surface of the first polarizing plate 119*a* to a side surface of the second polarizing plate 119*b* may be provided on a side surface of the display panel 110.

The side sealing agent 115 may have an elasticity and absorb an external impact to protect the side surface of the display panel 110, and may also prevent light leakage to the side surface of the display panel 110.

A pad portion (not shown) may be provided on one side, on which the side sealing agent 115 is not provided, among the sides of the display panel 110, and be connected to the printed circuit board 117 via the connecting member 116. The printed circuit board 117 may be bent and closely adhered to the back surface of the cover bottom 150 by using the bending characteristics of the connecting member 116.

At this time, the cover shield 160 positioned on the back of the cover bottom 150 may protect the printed circuit board 117 disposed on the back surface of the cover bottom 150 and efficiently dissipate heat generated from the printed circuit board 117.

The cover shield 160 may be fixed with a screw 157 that penetrates the bottom surface 161 and is inserted into the back surface of the cover bottom 150. To this end, an emboss hole 155 protruding toward the bottom surface 161 of the cover shield 160 may be formed at the horizontal surface 151 of the cover bottom 150.

Accordingly, the screw 157 may penetrate the bottom surface 161 of the cover shield 160 and be inserted into the emboss hole 155 of the cover bottom 150, so that the cover shield 160 may be fastened to the cover bottom 150.

Here, in the display device 100 according to the aspect of the present disclosure, the cover shield 160 may include the bottom surface 161 facing the back surface of the cover bottom 150, the side surface 163 vertically bent from the bottom surface 161 and entirely surrounding the side surface of the display device 100, and the top surface 165 vertically bent from the side surface 163 and surrounding a portion of an edge of the top surface of the display panel 110. Thus, the cover shield 160 may completely cover one side of the display device 100 on which the printed circuit board 117 is positioned.

Accordingly, in the display device 100 according to the aspect of the present disclosure, the cover shield 160 can serve as an outer cover of a display device such as a notebook computer, a mobile device and a TV.

In this case, by further positioning a design case 170 on the top surface 165 of the cover shield 160, a finished product of the display device 100 in a state that can be actually used by the user can be achieved.

The backlight unit (140 of FIG. 1) and the display panel 110 may be integrally modularized through the cover bottom 150 and the module films 211 and 221.

In more detail, the light source unit 135 may be seated on the horizontal surface 151 of the cover bottom 150, and the reflective plate 134 may be positioned on the light source unit 135 to expose only each light source 133 through the through hole 138.

Here, the reflective plate 134 may include the plurality of through holes 138. The reflective plate 134 may include the reflective plane 137 covering the horizontal surface 151 of the cover bottom 150, and the reflective side surface 139 that is bent upward along edges of the reflective plane 137 to cover an inner side of the side surface 153 of the cover bottom 150.

In addition, the optical unit 120 may be located on the light source unit 135 to be spaced apart from the light source unit 135 by a predetermined interval. The optical unit 120 and the display panel 110 positioned thereon may be supported by the module films 211 and 221.

Here, the module films 211 and 221 supporting the optical unit 120 and the display panel 110 may be divided into the first and second module films 211 and 221. In this case, the first module film 211 may be located on the back of the optical unit 120 to support the optical unit 120 and to keep an optical gap or an air gap G between the light source unit 135 and the optical unit 120.

In addition, the second module film 221 may be positioned on the back of the display panel 110 to support the display panel 110.

Referring to FIG. 3 in more detail, the optical unit 120 may include the first and second optical portions 121a and 121b, the diffusion portion 128, and the luminance enhancing portion 129. The first and second optical portions 121a and 121b, the diffusion portion 128 and the luminance enhancing portion 129 may be sequentially stacked on the light source unit 135.

Here, the first and second optical portions 121a and 121b may condense and diffuse a light incident from the light source 133 of the backlight unit (140 of FIG. 1) to improve luminance and light uniformity.

The first optical portion 121a may include a first support layer 123a, and a first lens layer 125a for condensing a light on the first support layer 123a. The second optical unit 121b positioned on the first optical portion 121a may include a second support layer 123b and a second lens layer 125b for condensing a light on the second support layer 123b.

In addition, the diffusion layer 126 may be positioned below the first support layer 123a.

Here, in more detail, the first and second support layers 123a and 123b of the first and second optical portions 121a and 121b may be made of a poly carbonate-based, poly sulfone-based, poly acrylate-based, poly styrene-based, poly vinyl chloride-based, poly vinyl alcohol-based, poly norbornene-based or polyester-based material which can transmit a light.

In addition, the first and second lens layers 125a and 125b respectively formed on the first and second support layers 123a and 123b may be made of a transparent acryl-based resin. The first lens layer 125a may be configured such that a plurality of first prisms 127a which each have a band shape along a length direction and are adjacently arranged in a form of repeating mountains and valleys may protrude from the first support layer 123a in a row, and the second lens layer 125b may be configured such that a plurality of second prisms 127b which each have a band shape along a length direction and are adjacently arranged in a form of repeating mountains and valleys may protrude from the second support layer 123b in a row.

Due to the first and second lens layers 125a and 125b formed of the first and second prisms 127a and 127b, a light is condensed to the display panel 110 positioned over the optical unit 120, thereby achieving an effect of a luminance increase.

Meanwhile, the first and second lens layers 125a and 125b may be formed of a polygonal prism in cross-section, a micro lens pattern, a lenticular lens, an emboss pattern, or a combination thereof.

In addition, in the drawing, heights of the first prisms 127a are the same and heights of the second prisms 127b are the same. However, the heights of the first prisms 127a adjacent to each other may be different, and the heights of the second prisms 127b adjacent to each other may be different, and for example, the heights of the first and second prisms 127a and 127b may be 10 μm to 40 μm, specifically, 10 μm to 30 μm.

In addition, pitches of the first prisms 127a may be different, and pitches of the second prisms 127b may be different. For example, the pitches corresponding to the bottom surfaces of the first prisms 127a may be 10 μm to 60 μm, specifically, 20 μm to 60 μm, and the pitches corresponding to the bottom surfaces of the second prisms 127b may be 10 μm to 60 μm, specifically, 20 μm to 60 μm. In addition, vertex angles of the first and second prisms 127a and 127b may be 80° to 100°, and within the above range, there may be an effect of luminance improvement.

Here, in the drawing, it is shown that the cross-sections of the first and second prisms 127a and 127b of the first and second lens layers 125a and 125b are the same, and the length directions of the first and second lens layers 125a and 125b are the same. However, the first and second lens layers 125a and 125b arranged in a row along the length directions of the first and second optical portions 121a and 121b may have the length directions perpendicular to each other, so that a luminance is improved while preventing a pitch moire from being generated between the first and second lens layers 125a and 125b.

That is, when the first lens layers 125a are arranged in a row along an X-axis direction defined in the drawing, the second lens layer 125b are arranged in a row along an Y-axis direction, defined in the drawing, perpendicular to the X-axis direction. The first and second lens layers 125a and 125b are arranged so that the length directions thereof are orthogonal to each other.

In addition, the diffusion layer 126 may be positioned on the back of the first support layer 123a of the first optical portion 121a. In other words, the diffusion layer 126 may be the lowermost end of the first and second optical portions 121a and 121b. Thus, the diffusion layer may serve to further diffuse a light emitted from the plurality of light sources 133 of the backlight unit (140 of FIG. 1) so that the light is incident on the first and second optical portions 121a and 121b in a wide range.

The diffusion layer 126 may contains spherical beads 126b in a transparent resin binder 126a coated on the back surface of the first support layer 123a of the first optical portion 121a, and has a spherical bead shape. A light diffusion function is achieved by the spherical beads 126b.

The binder 126a may be made of one selected from an acrylic resin, polyurethane, polyester, fluorine-based resin, silicon-based resin, polyamide and epoxy resin.

Here, the spherical bead 126b may use any one of acrylic resin, acrylic polymer, $CaCO_3$ (calcium carbonate), $BaSO_4$, silica, calcium phosphate, $TiO_2$, $SiO_2$, $CaCo_3$, $SnO_2$, $Mb_2O_5$, $ZnO_2$, $MgF_2$, $CeO_2$, $Al_2O_3$, $HfO_2$, $Na_3LaF_6$ and $LaF_6$, and alternatively, may be made of $TiO_2$ which is a high-diffusion material.

The binder 126a and the bead 126b may be colorless and transparent because a light needs to pass therethrough.

Here, an average particle diameter of the beads 126b may be 1 μm or more and 50 μm or less, and alternatively, 2 μm or more and 20 μm or less. If the average particle diameter is smaller than the above range, a satisfactory light diffusion function cannot be exhibited, and if the average particle diameter is larger than the above range, it is difficult to coat the resin composition forming the diffusion layer 126.

An amount of the beads 126b mixed in the diffusion layer 126 may be 10 parts by weight or more and 500 parts by weight or less, alternatively 10 parts by weight or more and 300 parts by weight or less, based on 100 parts by weight of the binder 126a. If the amount of the mixed beads 126b is less than the above range, a light diffusion effect is unsatisfactory, and if the amount of the mixed beads 126b is larger than the above range, it is difficult to coat the resin composition forming the diffusion layer 126.

The bead 126b may vary a light efficiency of the diffusion layer 126 according to its shape. The ball-shaped bead 126b may refract a light, which is incident from an outside, twice inside and have a reflection effect once.

In addition, the bead 126b in a shape of a snowman or a closed curve in which two ball shapes are connected may have an effect of transmitting a light, which is incident from an outside, on one side and diffusing the light on the other side. The random-shaped bead 126b may refract and reflect a light, which is incident from an outside, at multiple angles inside and may also have a diffused reflection effect.

In addition, the bead 126b may include another small bead of a small size inside the bead 126b. Such the bead 126b may refract and reflect a light, which is incident from an outside, at multiple angles inside and may also have a diffused reflection effect.

Accordingly, the diffusion layer 126 may refract and scatter the incident light to diffuse the light. Accordingly, through the configuration of the diffusion layer 126, the display device 100 according to the aspect of the present disclosure does not need to include a separate diffusion plate.

The diffusion portion 128 positioned on the first and second optical portions 121a and 121b may serve to diffuse and guide a light passing through the first and second optical portions 121a and 121b, and may serve to provide a white surface light source that is uniformly processed to the display panel 110.

The diffusion portion 128 may also be configured by including a light diffusion component such as a bead in a binder resin, or by forming a fine pattern at a lower surface thereof without including a bead.

Accordingly, the diffusion portion 128 may refract and scatter an incident light to diffuse the light, and may diffuse and output a non-uniform light emitted from the first and second optical portions 121a and 121b into a uniform light.

At this time, the diffusion portion 128 may have a high transparency and thus have excellent light transmittance and easy viscosity control. For example, the diffusion portion 128 may be made of an acryl-based, urethane-based, epoxy-based, vinyl-based, polyester-based or polyamide-based resin. A bead in the diffusion portion 128 may prevent a light from being partially concentrated by dispersing a light incident to the diffusion portion 128.

In addition, the diffusion portion 128 that does not include a bead may adjust a light scattering angle according to a shape of a fine pattern formed at the lower surface thereof. The fine pattern may be configured in various shapes such as an elliptical pattern, a polygonal pattern and the like, and by using a hologram pattern to refract a light incident by an interference pattern in an asymmetrical direction, a condensed light may be diffused at a more inclined angle.

The luminance enhancing portion 129 positioned on the diffusion portion 128 may be formed of a reflective polarizing film such as an advanced polarizing collimator film (APCF) or double brightness enhance film (DBEF). The luminance enhancing portion 129 may serve to enhance a luminance of a light supplied to the display panel 110 and improve am emission efficiency.

In other words, in the luminance enhancing portion 129, a high refractive layer and a low refractive layer may be stacked, and a light lost by reflection is re-reflected back to an upper surface, thereby regenerating a light to improve a luminance.

Accordingly, the optical unit 120 according to the aspect of the present disclosure may include the first and second optical portions 121a and 121b, the diffusion portion 128 and the luminance enhancing portion 129, and may process a light emitted from the light source 133 of the backlight unit (140 of FIG. 1) into a high-luminance surface light and provide the light to the display panel 110.

In this case, a dichroic layer (not shown) and a color conversion layer (not shown) may be further included below the first optical portion 121a. The dichroic layer and the color conversion layer may serve to process a light emitted from the light source 133 into a white light with improved color purity.

In other words, in the backlight unit (140 of FIG. 1) according to the aspect of the present disclosure, as a blue light is emitted from the light sources 133, while the blue light emitted from the light sources 133 passes through the dichroic layer, only the clearer blue light may be incident on the color conversion layer, and while the blue light incident on the color conversion layer passes through the color conversion layer, this blue light may be converted into a white light having an improved color purity.

At this time, a light diffusion adhesive (not shown) may be positioned between the first optical portion 121a and the second optical portion 121b, more precisely, between the first prism 127a of the first lens layer 125a and the second support layer 123b, or the first prism 127a may have an adhesive property. Accordingly, the first and second optical portions 121a and 121b can be attached and fixed to each other, and the vertex angle of the first prism 127a of the first optical portion 121a can also be protected.

In addition, a light-diffusing adhesive (not shown) may be further positioned between the second optical portion 121b and the diffusion portion 128, and between the diffusion portion 128 and the luminance enhancing portion 129. Accordingly, the first and second optical portions 121a and 121b, the diffusion portion 128 and the luminance enhancing portion 129 may form a composite optical sheet in a state where they are integrally bonded together.

The back surface of the optical unit 120 according to the aspect of the present disclosure may be supported by the first module film 211, and the back surface of the display panel 110 may be supported by the second module film 221.

At this time, the display panel 110 may be attached and fixed to the top surface of the second module film 221 through a first optical adhesive layer 230a.

Here, the first and second module films 211 and 221 may be made of a synthetic resin such as polymethylmethacrylate (PMMA) or polyethylene terephthalate (PET) of a thermoplastic resin. As the first and second module films 211 and 221 are respectively positioned on the back surface of the optical unit 120 and the back surface of the display panel 110, the first and second module films 211 and 221 may transmit a light such that a light emitted from the light source 133 is transmitted to the optical unit 120 and the light transmitted through the optical unit 120 is incident on the display panel 110.

In particular, in order to prevent a decrease in luminance, a light transmittance may be very high. By making the first and second module films 211 and 221 have a refractive index similar to that of the optical unit 120 and the display panel 110, there may be no refraction in light between the first and second module films 211 and 221 and the optical unit 120 and between the second module film 221 and the display panel 110.

At this time, the first module film 211 may have a larger area than the optical unit 120, and the second module film 221 may have a larger area than the display panel 110. Thus, a first edge portion 213 of the first module film 211 may be exposed along an edge of the optical unit 120, and a second edge portion 223 of the second module film 221 may be exposed along an edge of the display panel 110.

Here, the first edge portion 213 of the first module film 211 supporting the back surface of the optical unit 120 may be attached to and fixed to an outer side of the side surface 153 of the cover bottom 150 through the second optical adhesive layer 230b. The second edge portion 223 of the second module film 221, which is attached to the back surface of the display panel 110 and supports the display panel 110, may be attached to and fixed to an outer side of the first edge portion 213.

Accordingly, both of the first module film 211 supporting the back surface of the optical unit 120 and the second module film 221 supporting the back surface of the display panel 110 may be attached to and fixed to the side surface 153 of the cover bottom 150, so that the display panel 110 and the backlight unit (140 of FIG. 1) may be integrated with each other.

That is, in the display device 100 according to the aspect of the present disclosure, by attaching and fixing the first edge portion 213 of the first module film 211, which is positioned on the back surface of the optical unit 120, to the side surface 153 of the cover bottom 150, the optical unit 120 may be supported on its back by the cover bottom 150 and be modularized with the cover bottom 150, and by attaching and fixing the second module film 221, which is attached to and fixed to the display panel 110, to the first edge portion 213 of the first module film 211 through the second edge portion 223, the display panel 110 may be also modularized with the cover bottom 150.

Accordingly, the display panel 110 and the backlight unit (140 of FIG. 1) may be integrally modularized with each other through the cover bottom 150 and the module films 211 and 221.

Here, the first module film 211 may serve only to support the back surface of the optical unit 120 so that the first module film 211 and the back surface of the optical unit 120 are not attached and fixed to each other. Even if the first module film 211 is not attached and fixed to the optical unit 120, the optical unit 120 is interposed between the first module film which is attached to and fixed to the cover bottom 150 and the second module film positioned on the optical unit 120 so that the position of the optical unit 120 is fixed.

In addition, as the first module film 211 supports the back surface of the optical unit 120, the optical unit 120 and the light source unit 135 may keep the optical gap or air gap G.

That is, the first module film 211 may serve to modularize the optical unit 120 with the cover bottom 150, and serve to maintain the optical gap or the air gap G between the light source unit 135 and the optical unit 120.

Here, the backlight unit (140 of FIG. 1) need to be formed to have the optical gap or air gap (hereinafter referred to as the optical gap) G having a predetermined interval between the light source unit 135 and the optical unit 120. As the optical gap G is a color mixing space of lights emitted from the plurality of light sources 133 of the light source unit 135, the optical gap G may serve to allow the lights emitted from the plurality of light sources 133 to be uniformly color-mixed to be incident on the optical unit 120, or serve to prevent a thermal expansion of the optical unit 120 by a high-temperature heat generated from the plurality of light sources 133.

Accordingly, in the display device 100 according to the aspect of the present disclosure, the first module film 211 is positioned on the back surface of the optical unit 120 to support the back surface of the optical unit 120 and to modularize the optical unit 120 with the cover bottom 150, and thus the optical gap G can also be formed between the light source unit 135 and the optical unit 120.

Accordingly, the uniformly color-mixed light passes through the optical unit 120 and is processed into a high-quality surface light source to be incident on the display panel 110.

The first module film 211 may have a thickness of 100 μm to 130 μm so as to have a large resistance to bending. Through this, the first module film 211 does not deform due to an external force and can support the optical unit 120.

When the thickness of the first module film 211 is further increased, the resistance to an external force may be increased, but a transmittance of light incident from the light source unit 135 may be lowered, so that the first module film 211 has a thickness of 100 μm to 130 μm.

In particular, when the thickness of the first module film 211 is increased, it may be difficult to implement the recently required thinning of the backlight unit (140 of FIG. 1).

That is, by making the first module film 211 to have a thickness of 100 μm or more, the backlight unit (140 of FIG. 1) can be made as thin as possible within a limit of preventing deterioration of a mechanical property of the first module film 211 and satisfying a high light transmittance. By making the first module film 211 to have a thickness of 250 μm or less, the backlight unit (140 of FIG. 1) can be thinned and maximize preventing deterioration of a mechanical property of the first module film 211 and satisfying a high light transmittance.

At this time, the second module film 221 positioned on the optical unit 120 may be attached and fixed to the back surface of the display panel 110 through the first optical adhesive layer 230a, so that a separate mechanical property is not required. Therefore, the thickness of the second module film 221 may be freely adjusted within a limit that satisfies a high light transmittance.

Accordingly, the second module film 221 may have a thickness thinner than that of the first module film 211, and may have a thickness of 50 μm to 70 μm.

In particular, in the display device 100 according to the aspect of the present disclosure, by preventing the first module film 211 from being attached and fixed to the back surface of the optical unit 120, it is possible to prevent a warping phenomenon of the optical unit 120 from occurring.

That is, if the optical unit 120 is fixed through an adhesive force, in a process of thermal expansion and thermal contraction of the optical unit 120 due to a heat generated in driving the display device 100, a warping phenomenon in which the optical unit 120 is wrinkled may occur.

This causes a problem of deterioration of quality of the display device 100, such as spots in an image of the display panel 110.

Accordingly, in the display device 100 according to the aspect of the present disclosure, the first module film 211 may serve only to support the back surface of the optical unit 120 so that the first module film 211 and the optical unit 120 are not attached and fixed to each other, thereby preventing a warping phenomenon of the optical unit 120.

In addition, the second module film 221 may be also attached to and fixed to the back surface of the display panel 110 and be not attached to and fixed to the optical unit 120, thereby preventing a warping phenomenon of the optical unit 120.

Here, by forming the first optical adhesive layer 230a of a transparent adhesive material such as OCR, OCA or resin, all high-quality surface lights that pass through the optical unit 120 may be incident on the display panel 110. The second and third optical adhesive layers 230b and 230c may be freely used within a limit of attaching the first and second edge portions 213 and 223 of the first and second module films 211 and 221 to each other, or of attaching and fixing the first edge portion 213 to the outer side of the side surface 153 of the cover bottom 150.

As described above, in the display device 100 according to the aspect of the present disclosure, the display panel 110 and the backlight unit (140 of FIG. 1) are integrally modularized through the cover bottom 150 and the first and second module films 211 and 221. Thus, although a guide panel made of aluminum (Al) is not provided, it is possible to realize a light weight, a thin profile and a narrow bezel.

In other words, in order to realize the narrow bezel, even when a case top is removed, a guide panel (not shown) made of a metal material i.e., aluminum (Al) is an essential component so as to stably support the display panel 110. However, in the display device 100 according to the aspect of the present disclosure, the display panel 110 and the optical unit 120 are modularized with the cover bottom 150 and the first and second module films 211 and 221. Accordingly, even without a guide panel (not shown) made of aluminum (Al), it is possible to stably modularize the display panel 110 and the backlight unit (140 of FIG. 1) to have a light weight, a thin profile and a narrow bezel.

Therefore, the guide panel made of aluminum (Al) can be omitted, thereby reducing a material cost, and further, a process for assembling and fastening the guide panel can be omitted, thereby improving an efficiency of process.

In particular, the display device 100 according to the aspect of the present disclosure includes the diffusion layer 126 including the bead 126b made of TiO2, which is a high diffusion material, at the lowermost end of the optical unit 120, thereby providing a separate diffusion plate. Furthermore, by allowing the back surface of the optical unit 120 to be supported through the first module film 211, even without a separate glass diffusion plate (not shown), a sagging of the optical unit 120 can be prevented.

Therefore, the glass diffusion plate can also be omitted, and thus a material cost can be further reduced. Furthermore, additional equipment and processes for aligning and fixing the glass diffusion plate can be omitted, and thus an efficiency of process can be further improved.

At this time, the side surface 153 of the cover bottom 150 may be exposed to an outside of the first and second edge portions 213 and 223 of the first and second module films 211 and 221, or a light emitted from the backlight unit (140 of FIG. 1) may be leaked to the outside of the first and second edge portions 213 and 223. Thus, a design tape 180 having a black characteristic may be attached to the outer side of the second edge portion 223 of the second module film 221 positioned at the outermost side of the display device 100.

Alternatively, at least one of the first and second edge portions 213 and 223 of the first and second module films 211 and 221 may be formed to have a black characteristic.

FIGS. 4A to 4F are cross-sectional views illustrating a process sequence for modularizing a display device according to an aspect of the present disclosure.

Figure 4A:
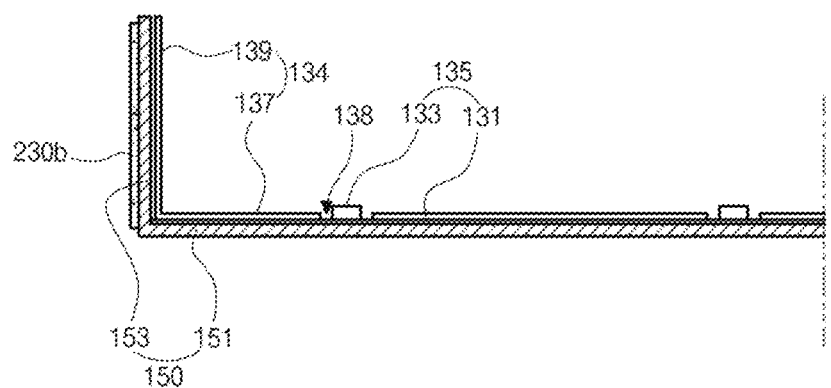
FIGS. 4A to 4F are cross-sectional views illustrating a process sequence for modularizing a display device according to an aspect of the present disclosure.

As shown in FIG. 4A, the light source unit 135 including the plate-shaped PCB 131 and the plurality of light sources 133 mounted at a predetermined interval on the PCB 131 may be placed on the horizontal surface 151 of the cover bottom 150. The reflective plate 134 may be placed on the light source unit 135 so that the plurality of light sources 133 are exposed through the through holes 138, respectively.

The second optical adhesive layer 230b is applied to the outer side of the side surface 153 of the cover bottom 150.

Figure 4B:
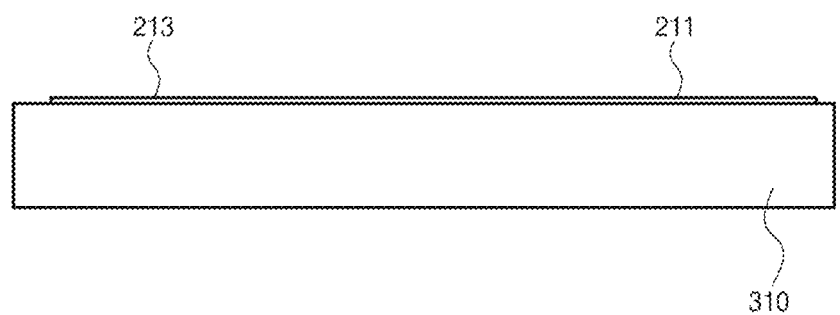
Figure 4C:
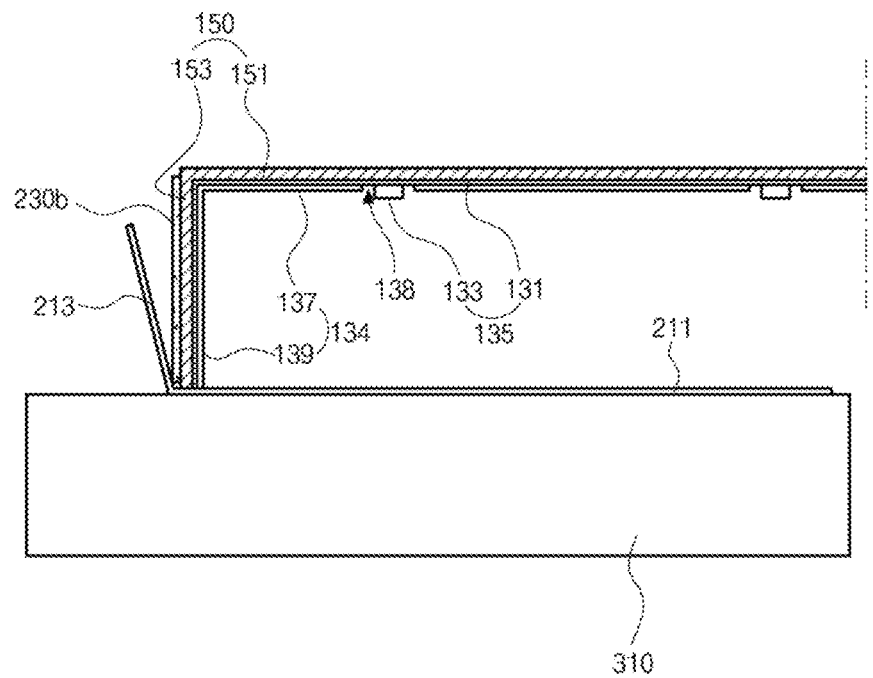

Next, as shown in FIG. 4B, after vacuum-bonding the first module film 211 on a vacuum plate 310, and then, as shown in FIG. 4C, the cover bottom 150 on which the reflective plate 134 and the light source unit 135 are seated may be positioned on the first module film 211 which is vacuum-bonded on the vacuum plate 310.

At this time, a part of the vacuum plate 310 may be released from vacuum, and then the first edge portion 213 of the first module film 211 may be bent, and be attached to and fixed to the second optical adhesive layer 230b coated on the side surface 153 of the cover bottom 150.

Figure 4D:
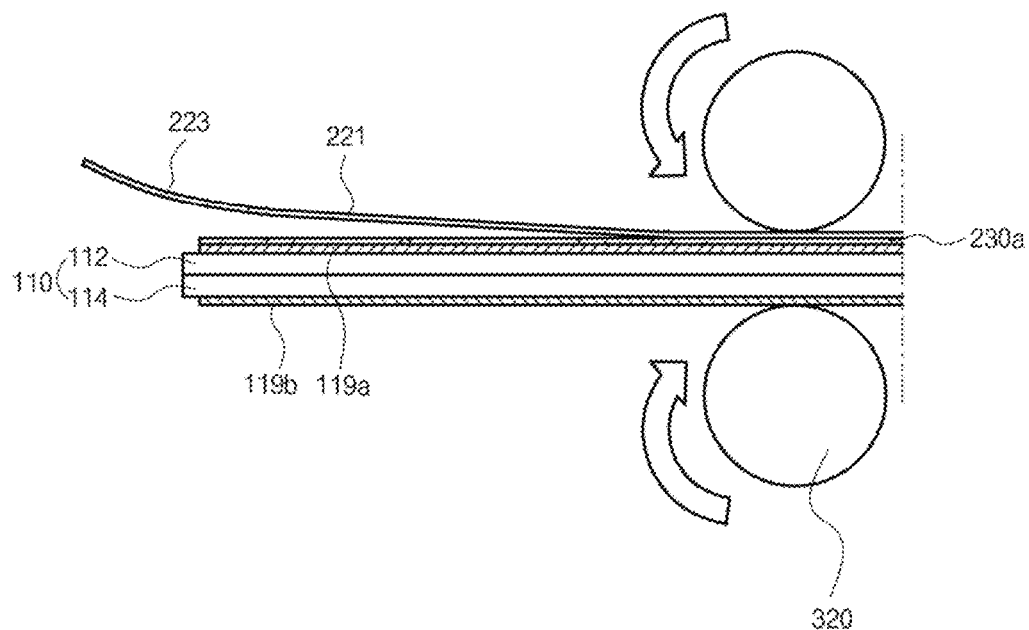
Figure 4E:
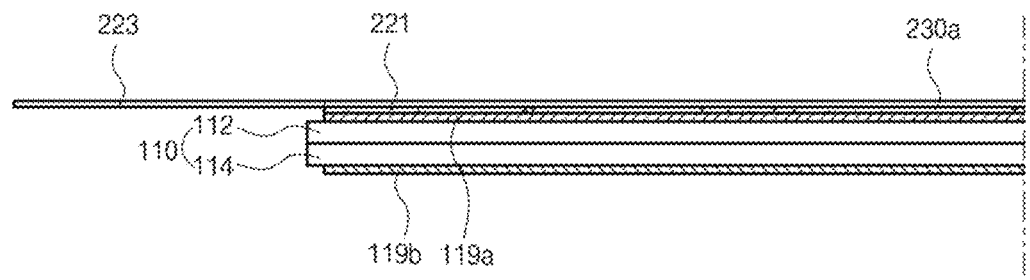

Next, as shown in FIG. 4D, the first optical adhesive layer 230a may be coated on a lower surface of the display panel 110, more precisely, on an outer side of the first polarizing plate 119a positioned on an outer side of the first substrate 112. Then, the second module film 221 may be laminated using a pressure roller 320 to the outer side of the first polarizing plate 119a through the first optical adhesive layer 230a.

At this time, the second module film 221 may have a larger area than the display panel 110, and as shown in FIG.

4E, the second edge portion 223 of the second module film 221 may be exposed to an outside of the display panel 110.

Figure 4F:
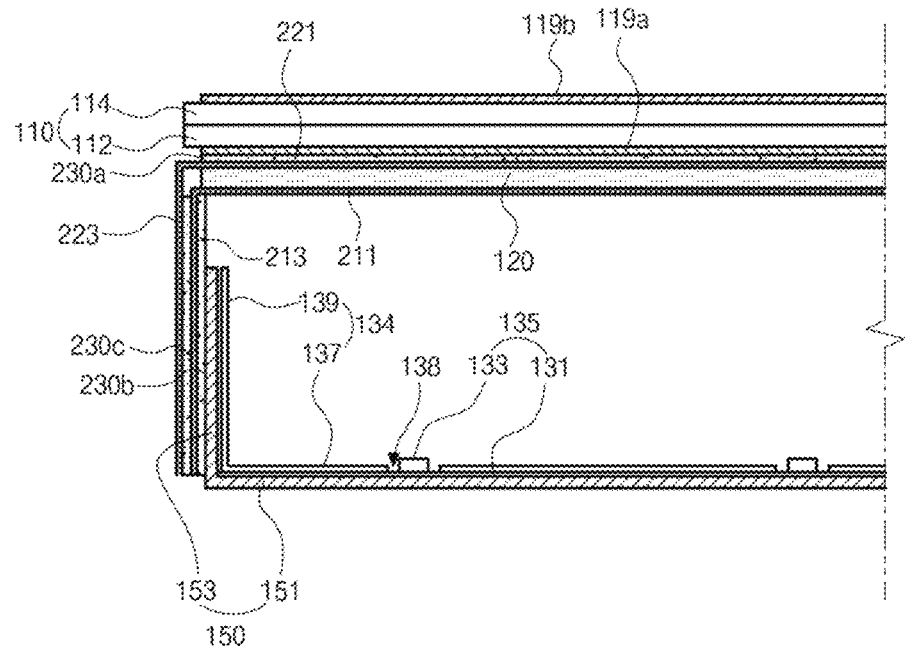

Next, as shown in FIG. 4F, after separating the first module film 211 and the cover bottom 150 from the vacuum plate 310, the optical unit 120 may be positioned on the first module film 211. At this time, the third optical adhesive layer 230c may be coated on the outer side of the first edge portion 213 of the first module film 211.

Finally, as shown in FIG. 4F, the laminated display panel 110 and second module film 221 may be placed on the optical unit 120. At this time, in order to place the second module film 221 on the optical unit 120, the display panel 110 and the second module film 221 may be positioned on the optical unit 120.

Thereafter, by attaching and fixing the second edge portion 223 of the second module film 221 to the third optical adhesive layer 230c, the modularization process of the display device 100 according to the aspect of the present disclosure may be completed.

Accordingly, in the display device 100 according to the aspect of the present disclosure, the first edge portion 213 of the first module film 211, which is positioned on the back surface of the optical unit 120, is attached to and fixed to the side surface 153 of the cover bottom 150, and thus the optical unit 120 is supported on its back surface by the first module film 211 and is modularized with the cover bottom 150. Furthermore, the second module film 221 attached to and fixed to the back surface of the display panel 110 is attached to and fixed to the first edge portion 213 of the first module film 211 through the second edge portion 223, and thus the display panel 110 is also modularized with the cover bottom 150.

Accordingly, the display panel 110 and the backlight unit (140 of FIG. 1) are integrally modularized with each other through the cover bottom 150 and the first and second module films 211 and 221.

Figure 5A:
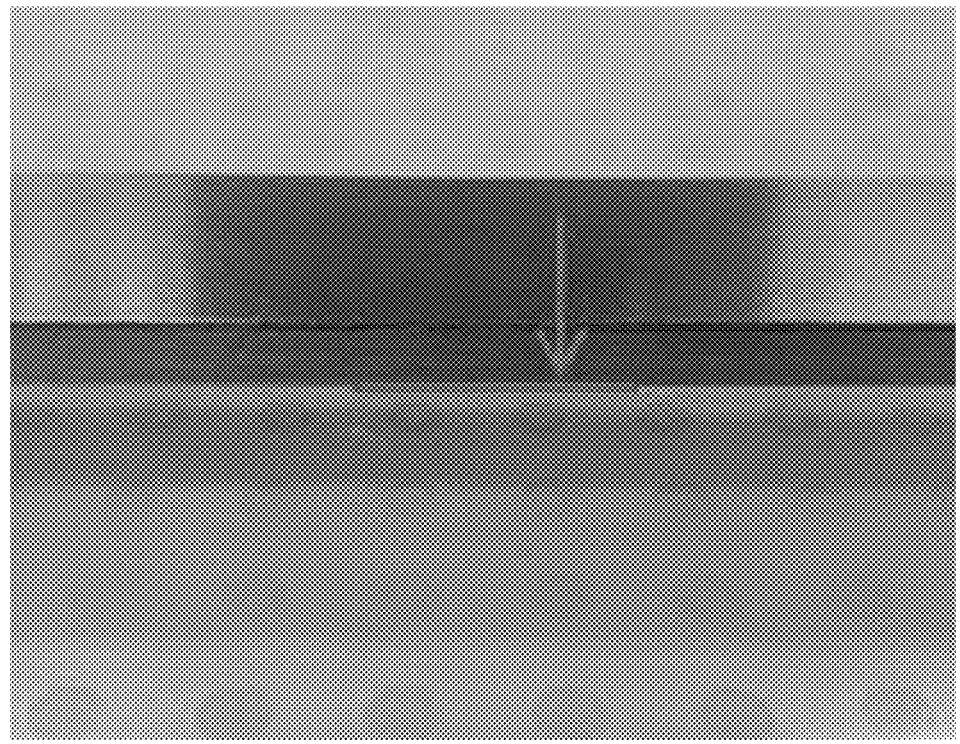
FIGS. 5A to 5C are photographs of experimental results measuring an optical gap of a display device according to an aspect of the present disclosure.
Figure 5B:
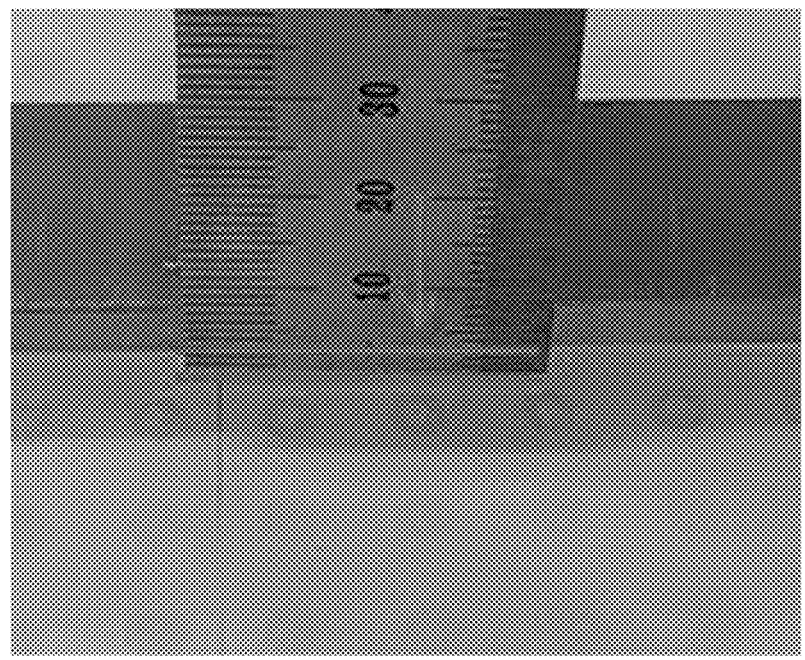
Figure 5C:
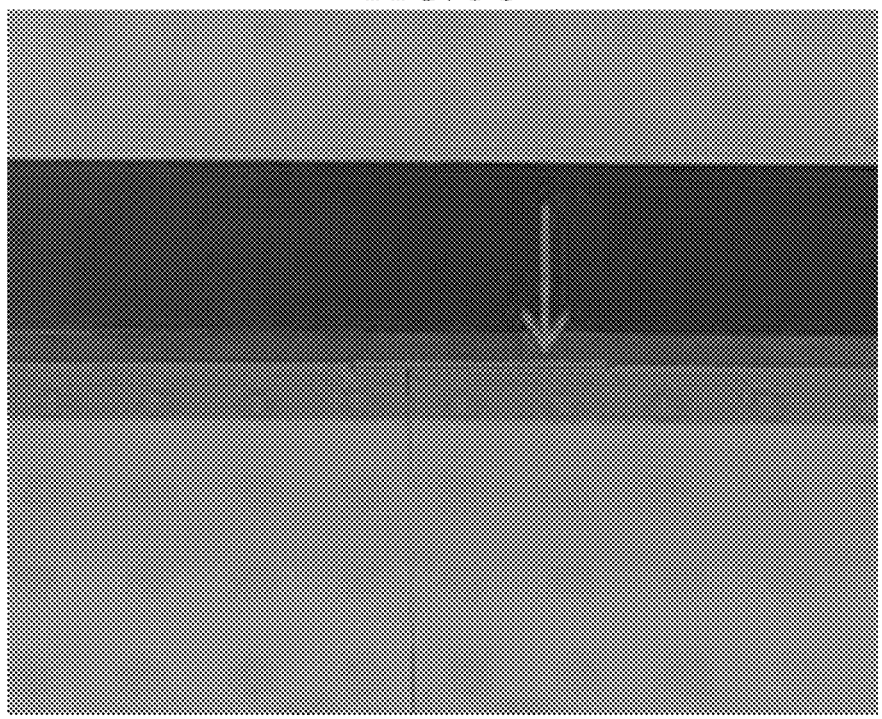
Figure 6A:
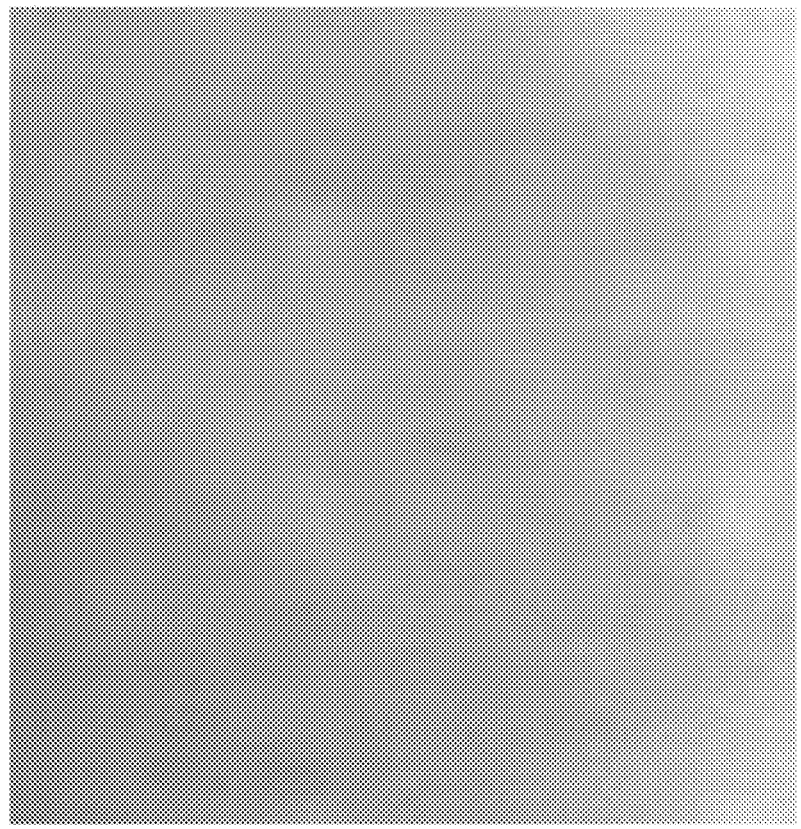
FIG. 6A is a photograph of an FOS evaluation measured before a high-temperature reliability test of a display device according to an aspect of the present disclosure.
Figure 6B:
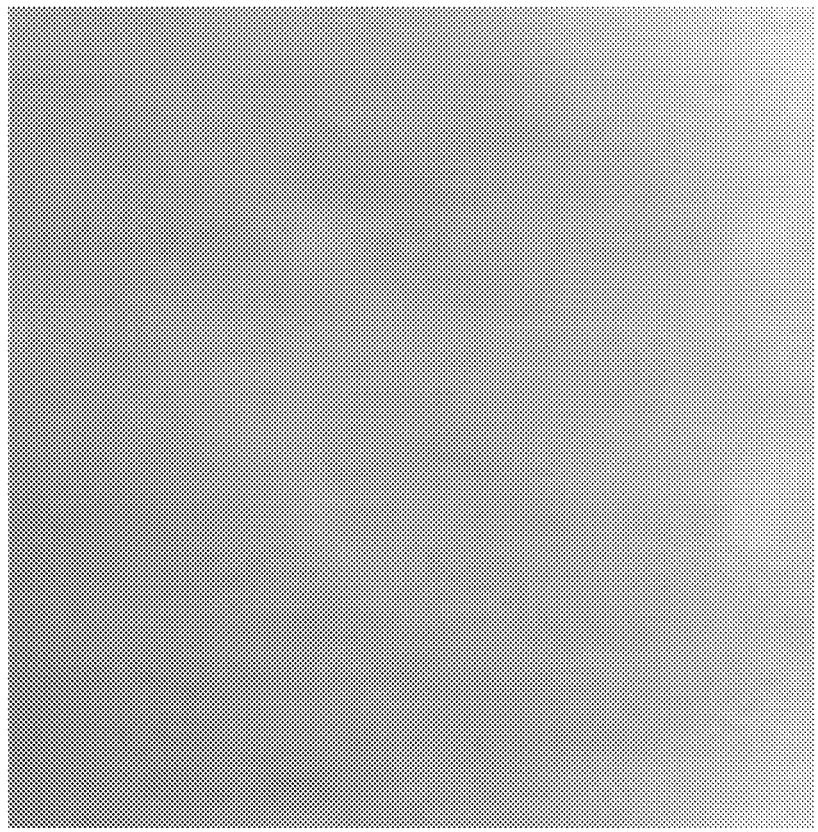
FIG. 6B is a photograph of an FOS evaluation measured after a high-temperature reliability test of a display device according to an aspect of the present disclosure.

FIGS. 5A to 5C are photographs of experimental results measuring an optical gap of a display device according to an aspect of the present disclosure. FIG. 6A is a photograph of a FOS evaluation measured before a high-temperature reliability test of a display device according to an aspect of the present disclosure, FIG. 6B is a photograph of a FOS evaluation measured after a high-temperature reliability test of a display device according to an aspect of the present disclosure.

First, FIG. 5A is a photograph of measuring the optical gap of the display device 100 according to the aspect of the present disclosure at room temperature before the high-temperature reliability test, and it can be seen that a constant optical gap G is maintained.

Through this, in the display device (100 in FIG. 2) according to the aspect of the present disclosure, it can be seen that even when the back surface of the optical unit (120 of FIG. 4F) is supported by the first module film (211 of FIG. 4F) and the back surface of the display panel (110 of FIG. 4F) is supported by the second module film (221 of FIG. 4F) and then the first and second module films (211 and 221 of FIG. 4F) are attached to and fixed to the cover bottom (150 of FIG. 4F), a sagging of the first and second module films (211 and 221 of FIG. 4F) does not occur.

When the high-temperature reliability test of the display device (100 of FIG. 2) according to the aspect of the present disclosure is performed for a certain period of time in a high-temperature environment of 60° C., it can be seen that the optical gap G is reduced as shown in FIG. 5B. It can be seen that the optical gap G maintains a constant optical gap G again after a predetermined time, about 1 hour, as shown in FIG. 5C.

That is, as in the aspect of the present disclosure, when the back surface of the optical unit (120 of FIG. 4F) is supported through the first module film (211 of FIG. 4F) and the display panel (110 of FIG. 4F) is supported through the second module film (221 of FIG. 4F), a sagging of the first and second module films (211 and 221 of FIG. 4F) does not occur at room temperature, and when the high-temperature reliability test is performed, some sagging of the first and second module films (211 and 221 of FIG. 4F) occurs. However, this sagging is restored again after a predetermined time elapses.

Therefore, it can be seen that even if a separate guide panel (not shown) made of aluminum (Al) or a glass diffusion plate (not shown) is not provided, the display panel (110 in FIG. 4F) and the backlight unit (FIG. 4F) can be stably modularized to have a light weight, a thin profile and a narrow bezel.

FIG. 6A is a photograph of an FOS evaluation of a lattice mura before the high-temperature reliability test is performed, and the FOS evaluation indicates a Front of Screen (FOS) state of the display device (100 of FIG. 2). It can be seen that there is almost no significant difference in variation between the FOS evaluation of FIG. 6A and the FOS evaluation of the lattice mura after the high-temperature reliability test of FIG. 6B is performed.

As described above, in the display device (100 of FIG. 2) according to the aspect of the present disclosure, the display panel (110 of FIG. 4F) and the backlight unit (140 of FIG. 1) are integrally modularized through the cover bottom (150 of FIG. 4F) and the first and second module films (211 and 221 of FIG. 4F). Thus, although a guide panel made of aluminum (Al) is not provided, it is possible to realize a light weight, a thin profile and a narrow bezel.

Therefore, a guide panel made of aluminum (Al) can be omitted, thereby reducing a material cost, and further, a process for assembling and fastening the guide panel can be omitted, thereby improving an efficiency of process.

In particular, the display device (100 of FIG. 2) according to the aspect of the present disclosure includes the diffusion layer (126 of FIG. 3) including the bead (126b of FIG. 3) made of TiO2, which is a high diffusion material, at the lowermost end of the optical unit (120 of FIG. 4F), thereby providing a separate diffusion plate. Furthermore, by allowing the back surface of the optical unit (120 of FIG. 4F) to be supported through the first module film (211 of FIG. 4F), even without a separate glass diffusion plate, a sagging of the optical unit (120 of FIG. 4F) can be prevented.

Therefore, the glass diffusion plate can also be omitted, and thus a material cost can be further reduced. Furthermore, additional equipment and processes for aligning and fixing the glass diffusion plate can be omitted, and thus an efficiency of process can be further improved.

In the above description, the cover bottom (150 of FIG. 4F) may be referred to as a bottom cover or lower cover.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
a light source unit including a plurality of light sources;

a cover bottom including a horizontal surface on which the plurality of light sources are seated, and a side surface bent along an edge of the horizontal surface;

an optical unit disposed on the light source unit;

a display panel disposed on the optical unit;

a first module film being transparent, supporting a back surface of the optical unit, and including a first edge portion attached to and fixed to an outer side of the side surface of the cover bottom; and a second module film being transparent, attached to a back surface of the display panel, and including a second edge portion attached to and fixed to an outer side of the first edge portion.

2. The display device of claim 1, wherein the first and second module films do not have adhesiveness, wherein a first optical adhesive layer is transparent and interposed between the second module film and the back surface of the display panel, wherein a second optical adhesive layer is interposed between the first edge portion and the side surface of the cover bottom, and wherein a third optical adhesive layer is interposed between the first edge portion and the second edge portion.

3. The display device of claim 1, wherein the optical unit is interposed between the first and second module films and has a fixed position.

4. The display device of claim 1, wherein the first module film has a thickness of 100 μm to 130 μm and the second module film has a thickness thinner than that of the first module film.

5. The display device of claim 1, wherein at least one of the first and second edge portions has a black characteristic.

6. The display device of claim 1, further comprising a design tape having a black characteristic and attached to an outer side of the second edge portion.

7. The display device of claim 1, wherein the optical unit includes a diffusion layer positioned at a lowermost end of the optical unit and includes a bead made of a high diffusion material.

8. The display device of claim 7, wherein the optical unit includes first and second optical portions each including a lens layer, a diffusion portion, and a luminance enhancing portion.

9. The display device of claim 8, wherein the diffusion layer includes a binder resin which is coated on a back surface of a support layer of the first optical portion and contains the bead.

10. The display device of claim 1, further comprising a side sealing agent disposed on a side surface of the display panel.

11. The display device of claim 10, further comprising a printed circuit board connected to one side of the display panel on which the side sealing agent is not provided via a connecting member, and wherein the printed circuit board is bent and closely adhered to a back surface of the cover bottom.

12. The display device of claim 11, further comprising a cover shield protecting the printed circuit board and positioned on the back surface of the cover bottom, wherein the cover shield includes:

a bottom surface facing the back surface of the cover bottom, a side surface vertically bent from the bottom surface and covering the side surface of the cover bottom and the side surface of the display panel, and a top surface vertically bent from the side surface of the cover shield and surrounding a portion of an edge of a top surface of the display panel.

13. The display device of claim 12, further comprising a design case disposed on the top surface of the cover shield.

14. A display device, comprising:

a display panel;

a backlight unit disposed on a back surface of the display panel, and including:

a light source unit including a plurality of light sources, a reflective plate disposed on the light source unit and including a plurality of through holes exposing only the plurality of light sources, and an optical unit disposed on the reflective plate;

a cover bottom including a horizontal surface on which the plurality of light sources are seated, and a side surface bent along an edge of the horizontal surface;

a first module film being transparent, supporting a back surface of the optical unit, and including a first edge portion attached to and fixed to an outer side of the side surface of the cover bottom; and a second module film being transparent, attached to a back surface of the display panel, and including a second edge portion attached to and fixed to an outer side of the first edge portion, wherein the display panel and the backlight unit are integrally modularized through the cover bottom and the first and second module films.

15. The display device of claim 14, wherein the optical unit is interposed between the first and second module films and has a fixed position.

* * * * *